United States Patent [19]

Sato et al.

[11] Patent Number: 4,860,221

[45] Date of Patent: Aug. 22, 1989

[54] MAGNETIC RESONANCE IMAGING SYSTEM

[75] Inventors: Makoto Sato, Ootawara; Toshio Uehara, Tochigi, both of Japan

[73] Assignee: Kabushiki Kaisha Toshiba, Kawasaki, Japan

[21] Appl. No.: 897,305

[22] Filed: Aug. 18, 1986

[30] Foreign Application Priority Data

Aug. 21, 1985 [JP] Japan ................................ 60-181855

[51] Int. Cl.⁴ .............................................. G06F 3/14
[52] U.S. Cl. ..................................... 364/522; 364/521;
364/413.22; 378/901
[58] Field of Search ............... 324/307, 308, 309, 310;
364/522, 518, 521, 414, 413.22; 382/46;
378/901, 98, 99; 358/101, 901

[56] References Cited

U.S. PATENT DOCUMENTS

| | | | |
|---|---|---|---|
| 4,472,683 | 9/1984 | Sekihara et al. | 324/309 |
| 4,558,425 | 12/1985 | Yamamoto et al. | 364/555 |
| 4,609,872 | 9/1986 | O'Donnell | 324/306 |
| 4,618,978 | 10/1986 | Cosman | 378/164 |
| 4,620,153 | 10/1986 | Hino | 324/309 |
| 4,642,621 | 2/1987 | Nemoto et al. | 340/721 |
| 4,674,046 | 6/1987 | Ozeki et al. | 364/414 |
| 4,737,921 | 4/1988 | Goldwasser et al. | 364/518 |

Primary Examiner—Gary V. Harkcom
Assistant Examiner—Phu K. Nguyen
Attorney, Agent, or Firm—Foley & Lardner, Schwartz, Jeffery, Schwaab, Mack, Blumenthal & Evans

[57] ABSTRACT

An magnetic resonance imaging (MRI) system comprises an image pick-up section having a slice selector for selecting a position and a gradient of a slice, the image pick-up section exciting the magnetic resonance (MR) in a slice of an object under inspection as selected, to collect MR data and to obtain the MR image data, a memory section for storing the MR image data picked up by the image pick-up section, together with its associated slice position data, and a display section for displaying an image. The MRI system further includes an MR image display control section for reading out desired MR image data from the memory section, and causing the display section to display the MR image of one or more slices, a marker display control section for displaying a marker to designate an image picked up slice, superposing on the MR image of the arbitrary slice as displayed by the display section, and an image pick up control section for setting up the conditions for of these conditions.

10 Claims, 9 Drawing Sheets

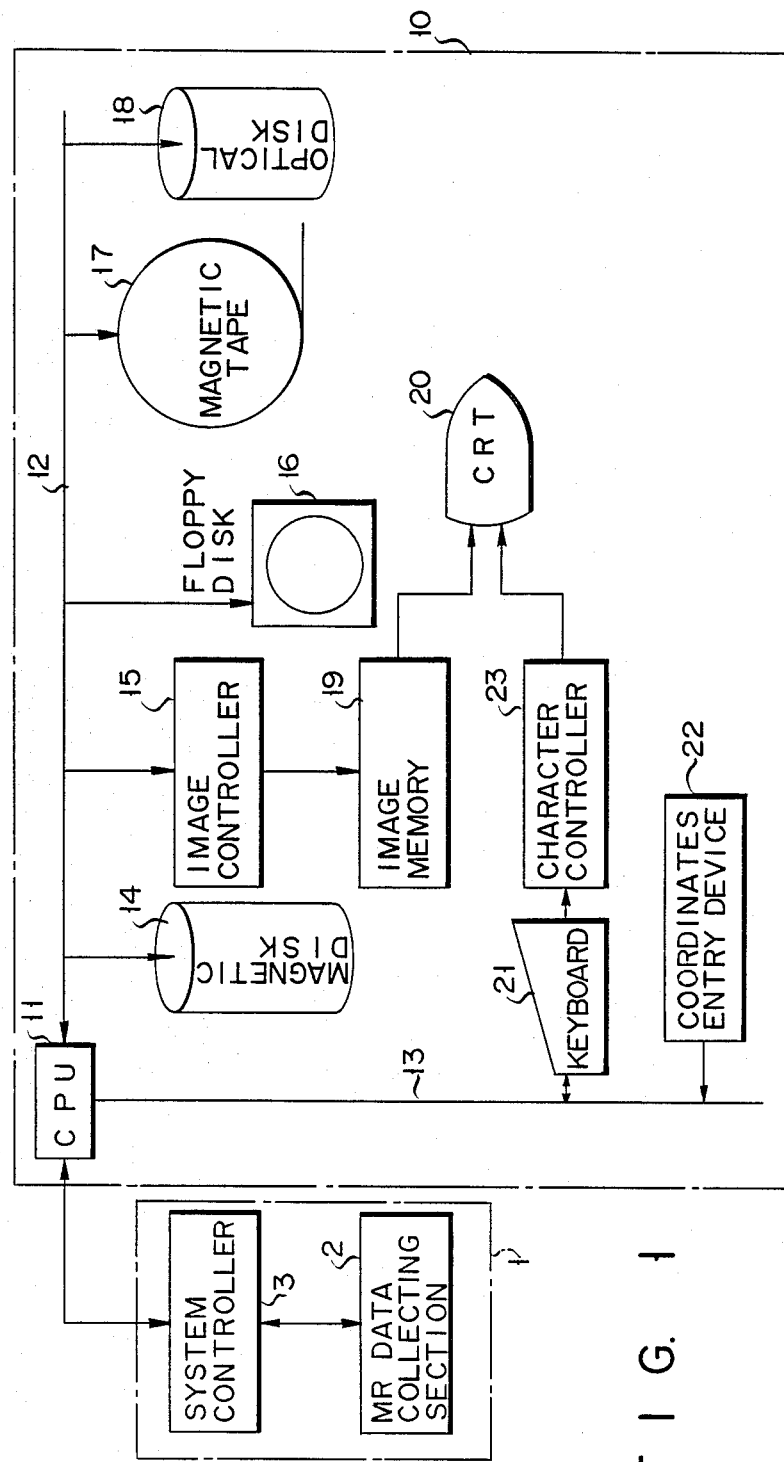
F I G. 1

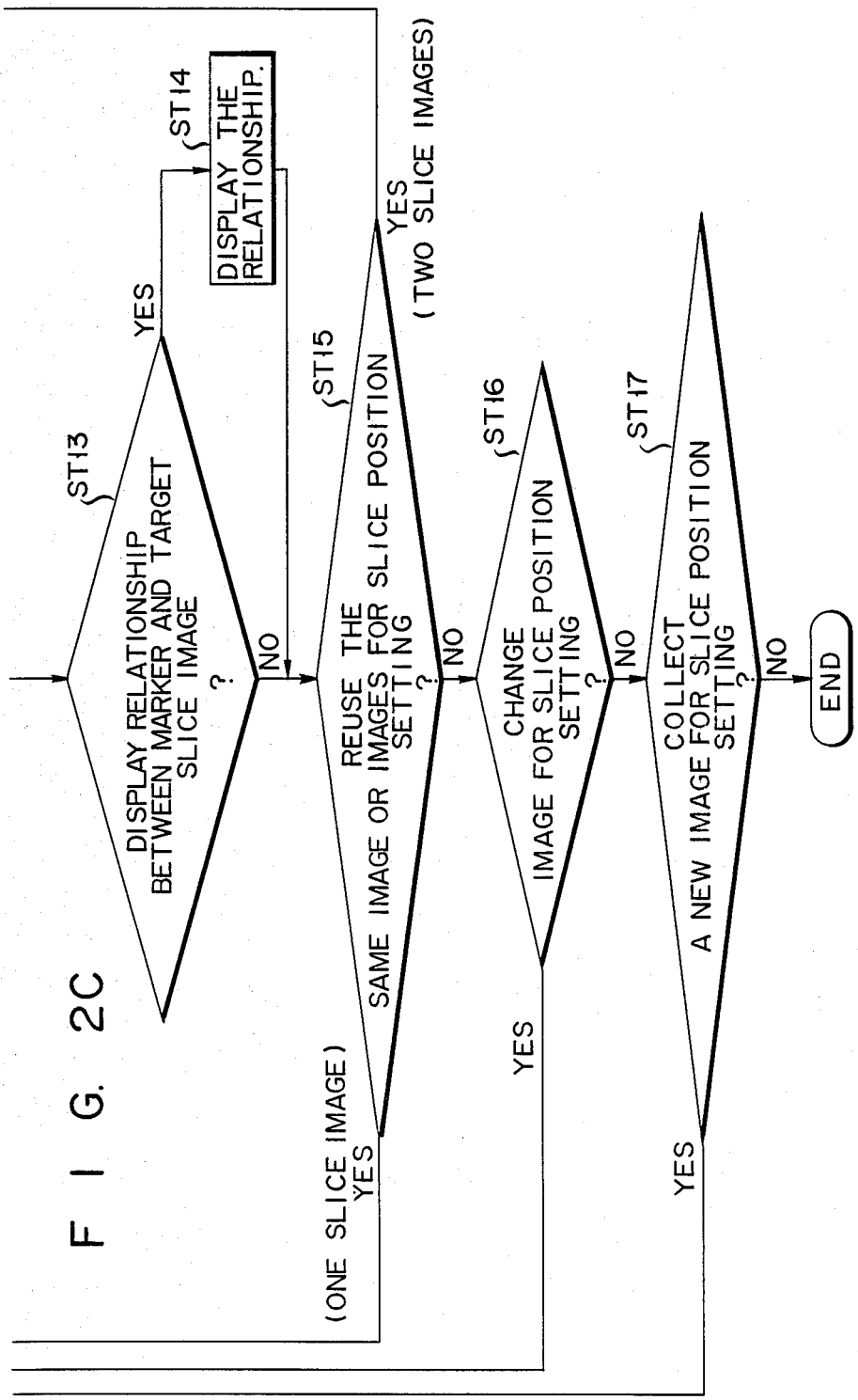

FIG. 4
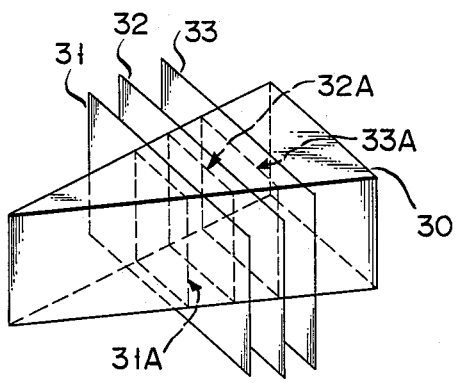
FIG. 5A  FIG. 5B  FIG. 5C
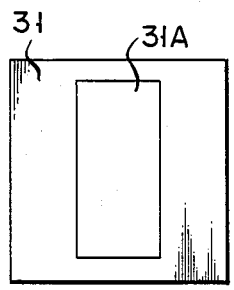 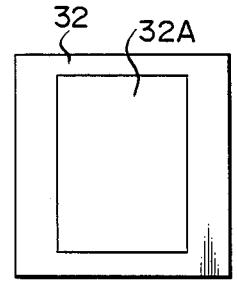 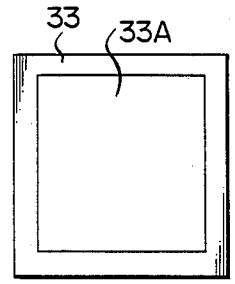

F I G. 6
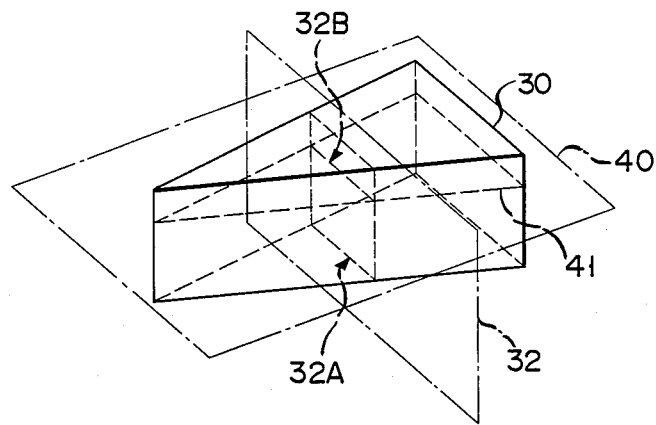
F I G. 7A
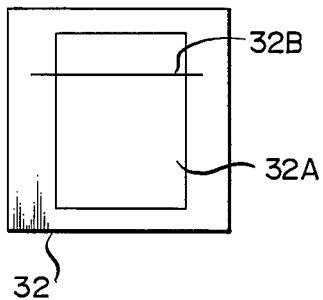
F I G. 7B
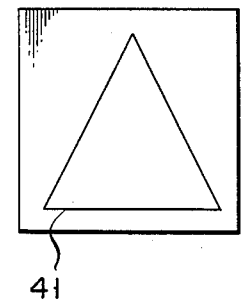

MAGNETIC RESONANCE IMAGING SYSTEM

BACKGROUND OF THE INVENTION

This invention relates to the MRI (magnetic resonance imaging) technology which is used mainly for medical diagnosis, and forms an image consisting of MR information on a selected slice by using a computer tomography, and more particularly to an MRI system which can exactly and readily select the slice position.

In the MRI system, a static magnetic field is uniformly applied to an object under inspection. At the same time, a gradient magnetic field, superposing the static magnetic field, is applied to the same. With the application of these magnetic fields, the object is applied with a selective excitation pulse of an electromagnetic wave with a resonance frequency (Larmor frequency) which corresponds to the magnetic field of a specific atomic nucleus. As a result, a magnetic resonance (MR) is selectively excited at the slice as defined by the static magnetic field and the gradient magnetic field. To excite the MR, a high frequency excitation pulse other than the select excitation pulse is often used. In most cases, the high frequency pulse is used in an additional manner. A signal generated at the slice by the MR is detected as an MR signal. In detecting this MR signal, a gradient magnetic field existing along the slice is applied, providing the location information at the slice. The MR signals thus obtained are used for forming an image based on the MR information.

In usual systems, the gradient magnetic field, which is superposed on the uniform static magnetic field Ho, is defined by gradient magnetic fields Gx, Gy and Gz in the x, y and z directions of the three dimensional rectangular coordinates. A gradient magnetic field of a desired direction can be composed by appropriately and selectively combining these gradient magnetic fields Gx, Gy and Gz. In other words, an intensity ratio among the gradient magnetic fields Gx, Gy and Gz defines a gradient angle of the slice to be selectively excited. By changing the frequency of the excitation pulse Hl, a position existing in the magnetic field direction (usually z-axis direction) of the slice on the same atomic nucleus can be selected. Thus, according to the MRI system, the MR image of the slice can easily be picked up in various directions and at various locations.

The MRI system capable of tomographing a proper slice is very useful, but the selection of a desired slice is not easy. More specifically, this system can take a tomogram of a desired, three-dimensional image. However, it is very difficult to exactly obtain a specific position of the slice to be picked up, and also the positional relation between this slice and the tomographed slice.

For the above reason, in tomographing the object by the MRI system currently used, a target portion of the object to be tomographed is roughly picked up, and its near portion is tomographed many times to have many tomographs under various conditions. From those tomograms, a desired one is searched.

Such tomographing operation needs many unnecessary tomographing operations including retomographings. This is time-consuming and troublesome work, and frequently applies heavy mental and physical load to the object, e.g. a patient.

SUMMARY OF THE INVENTION

An object of this invention is to provide an MRI system which can easily and exactly set a tomographed slice on the basis of a previously tomographed slice, and further can easily grasp a relationship of positions of the arbitrary slice and the tomographed slice.

To achieve the above object, the MRI system according to this invention includes a slice designating section which displays MR images of a single or a plurality of parallel slices as tomographed by a tomographing section, and inputs a marker indicating a slice to be tomographed, displaying it over the displayed image, thereby to designate the tomographed slice, and a control section for obtaining the conditions for tomographing the slice designated by the above means, and controlling the tomographing section according to these conditions, thereby to tomograph the MR image of the tomographed slice.

According to this system, by designating at least one of the position and the size of a tomographed slice with respect to a single or a plurality of arbitrary slices, this tomographed slice can be designated. With this feature, it is easy to grasp a relationship of positions of the tomographed slice and the arbitrary slice, and the position of the slice of an MR image to be tomographed. This system, when applied to the medical system, can provide an exact diagnosis.

BRIEF DESCRIPTION OF THE DRAWINGS

FIG. 1 is a block diagram showing an arrangement of an MRI system according to one embodiment of this invention;

FIGS. 2A-2C show a flowchart showing a flow of the processing of the FIG. 1 system;

FIG. 4 perspectively shows a relationship of positions of an object under inspection and a plurality of parallel slices in the FIG. 1 embodiment;

FIGS. 5A through 5C show a model of an MR image of each slice shown in FIG. 4;

FIG. 6 shows a relationship of the positions of the object, one slice and a tomographed slice;

FIGS. 7A and FIG. 7B show a displayed image containing an MR image of an arbitrary slice and a line marker overlaid on the former, and an MR image of the tomographed slice;

DETAILED DESCRIPTION OF THE PREFERRED EMBODIMENT

Figure 2A:
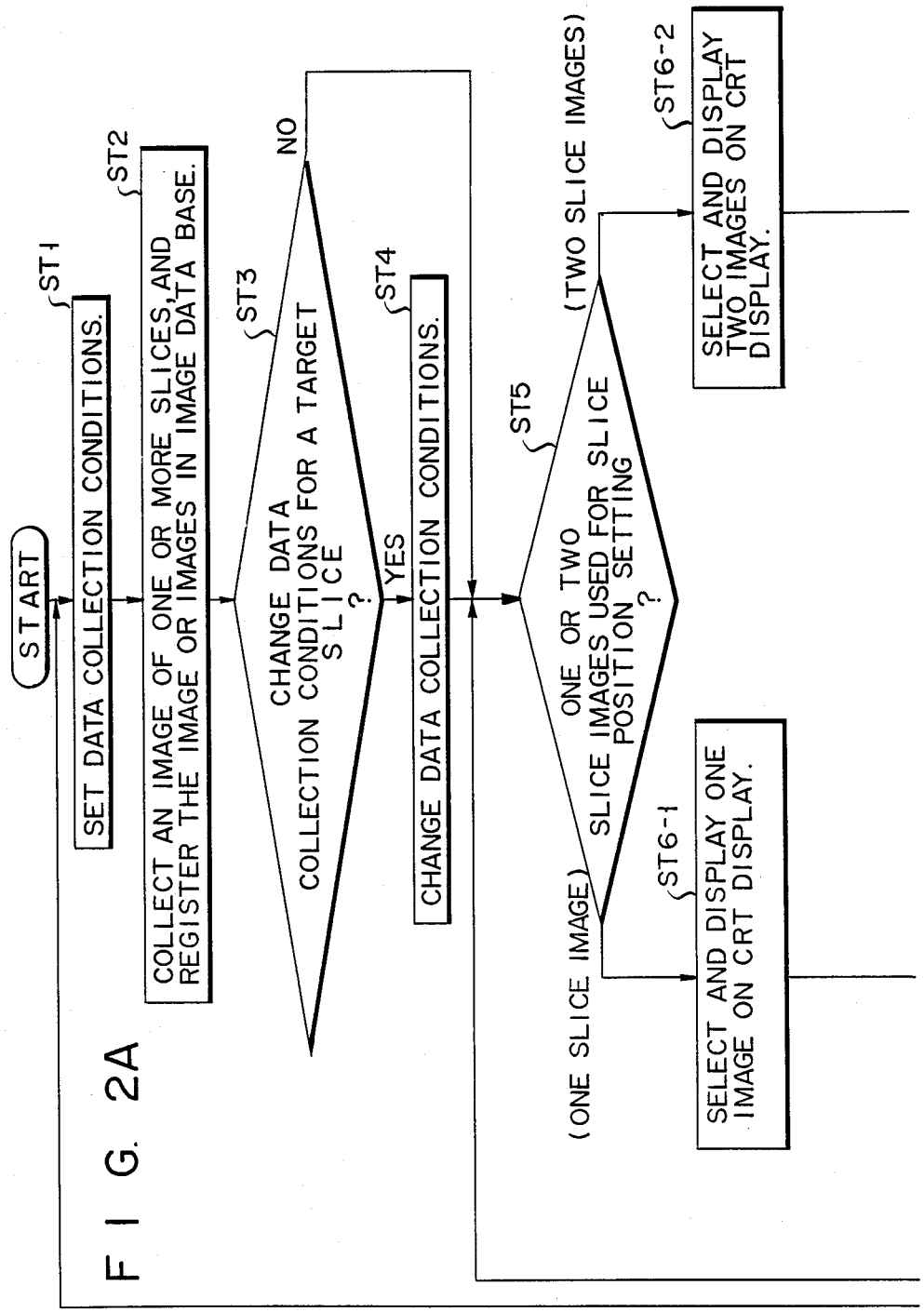
Figure 2B:
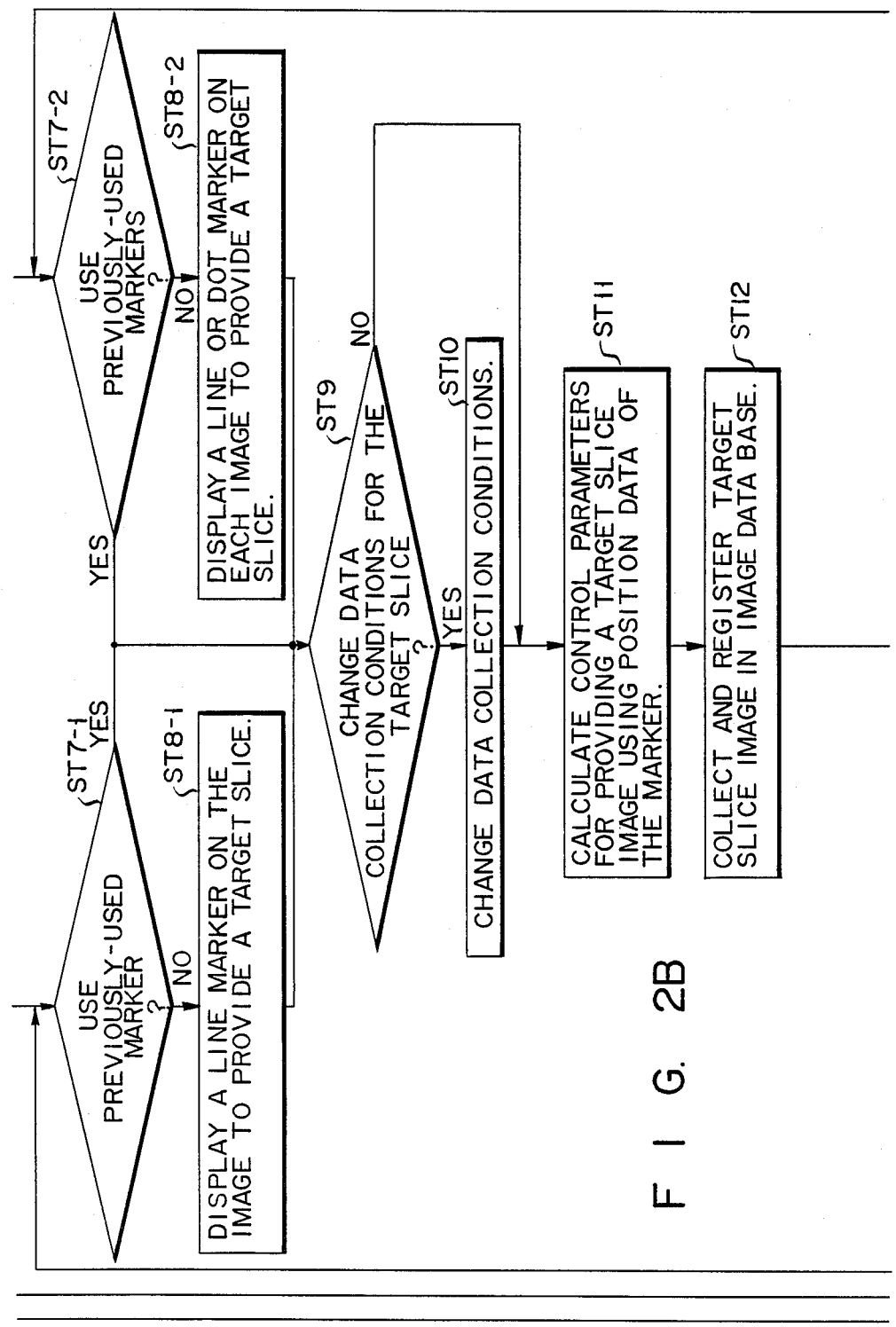

Referring to FIG. 1, there is shown an MRI system according to one embodiment of this invention. The system is comprised of an MR image pick up section 1 and a slice designating section 10 for designating a slice image picked up by the MR image pick up section 1.

The MR image pick up section 1 further comprises an MR data collecting section 2 and a system controller 3. The MR data collecting section 2 collects MR data of a selected slice of an object under inspection, by using the MR phenomenon. The system controller 3 controls many necessary items by controlling the MR data collecting section 2. These items are, for example, a voltage applied to each gradient magnetic field generating coil in the MR data collecting section 2, the timing of application of this voltage, the frequency of an excitation pulse applied to a probe head, the timing of application of this pulse, and the timing of ADC (analog-to-digital conversion) of an MR signal as received by the probe head.

A functional block diagram of the slice designating section 10 will be described in detail.

CPU (central processing unit) 11, which controls the overall system, is connected through DMA (direct memory access) bus 12 to various types of memories, such as magnetic disc 14, floppy disc 16, magnetic tape 17 and optical disc 18. Further, CPU 11 is connected through DMA bus 12 to image controller 15. Image controller 15 is connected to image memory 19 and CRT (cathode ray tube) display 20. CPU 11 is also connected via I/0 (input/output) bus 13 to coordinates entry device 22 such as a track ball or a mouse. Keyboard 21 is connected to character controller 23 which is further connected to CRT display 20.

This system uses CRT display 20 for displaying a single or a plurality of parallel slices as image picked up by MR image pick up section 1. It is necessary to input a line or dot marker on the MR image of one of the slices displayed by display 20, and to designate a position of the tomographed slice. To this end, there are provided coordinates entry device 22, CPU 11, image controller 15 and image memory 19. A display control means is needed for displaying three-dimensional positions of one slice and a tomographed slice on the screen of display 20. The display control means contains keyboard 21, CPU 11, image controller 15 and image memory 19.

The operation of this system will be described referring to FIGS. 1 and 4 to 10, and flowcharts shown in FIGS. 2A–2C and 3.

As a first step to operate this system, it is necessary to set up the conditions for the collection of the MR image of an arbitrary slice of an object under inspection. This slice is used as the base for designating a tomographed slice. The collection conditions are entered by keyboard 21 (step 1). For example, as shown in FIG. 4, the conditions for collecting three arbitrary slices 31 to 33 of an object under inspection 30, that is, the multi-slice collection conditions, are set up. In the system operation, the conditions are entered into MR image pick up section 1 via CPU 11. Under control of system controller 3, MR data collecting section 2 collects data. Using the collected data, CPU 11 reconstructs the MR image of each slice. In this way, images 31A to 33A (FIGS. 4, and 5A to 5C) of slices 31 to 33 are formed. These images, as image data base, are stored into memory devices 14, 16 17 and 18 (step 2).

Then, whether the collection conditions for an arbitrary slice are changed or not is decided, and the decision is entered by a related key operation on keyboard 21 (step 3). Display of each image on display 20 may assist such decision. If change of the collection conditions is required, a related key on keyboard 21 is operated (step 4).

After the end of the image storage due to the condition change or when no condition change is performed in step 5, the control goes to step 5. In this step, an operator operates the related key on keyboard 21 to select one slice or two slices of these three images. To designate a tomographed slice by one image, the control goes to steps 6-1, 7-1 and 8-1. For the designation of two tomographic image by two images, the control goes to steps 6-2, 7-2 and 8-2.

The tomographed slice by one image will be described referring to FIGS. 6 and 7A, and according to the flow of steps 6-1, 7-1 and 8-1.

An operator selects, by keyboard 21, an image of an arbitrary slice from those three images (step 6-1). When the image 32A of slice 32 is selected, CPU 11 reads out this image from memories 14, 16, 17 and 18, and displays it on display 20 after passing it through image controller 15 and image memory 19 (FIG. 7A).

Then, the control shifts to step 7-1. This step is for designating the second and succeeding tomographed slices, however. Therefore, for designating the first tomographed slice, the control goes to step 8-1. In this step, a line or dot marker is displayed on the image of the arbitrary slice as displayed on the screen of display 20, and a position of the tomographed slice is entered. To this end, an operator inputs the marker coordinates by MR data collecting section 2, for example, to set line marker 32B at a position of interest on slice 32A, as shown in FIG. 7A. In response to the entering of the marker coordinates, the coordinates data is input through CPU 11 to image controller 15. Image controller 15 writes line marker 32B in image memory 19, superposing the image of the slice 32A. As a result of this, line marker 32B is displayed superimposed on the slice image 32A at the position of interest.

The tomographed slice as designated by such marker coordinates includes line marker 32B as shown in FIG. 6, and serves to designate as another tomographed slice 40 orthogonal to slice 32. The image 41 on the slice 40 is tomographed by MR image pick up section 1.

The designation of the tomographed slice by two images will be described referring to FIGS. 8 and 9a, and according to the flow of steps 6-2, 7-2 and 8-2.

In step 6-2, the operator operates keyboard 21 to select two slice images from these three images. The images 31A and 33A of slices 31 and 33, for example, are displayed on the screen of display 20 in a space shared manner, as shown in FIG. 9A. The control passes step 7-2 for the above reason, and reaches step 8-2. In this step, line markers 31B and 33B as shown in FIG. 9A are displayed on the images 31 and 33 on the screen of display 20, to enter positions of these markers 31B and 3B. The sequence of operations from the step of entering the marker coordinates by coordinates entry device 22 to the step of displaying line markers 31B and 33B by display 20, is performed as in the manner already mentioned.

Figure 8:
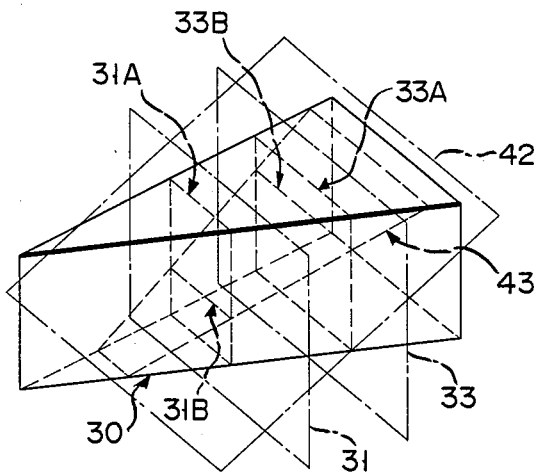
FIG. 8 perspectively shows a relationship of positions of two arbitrary slices and a tomographed slice.
Figure 9A:
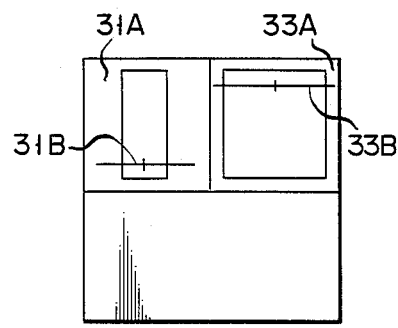
FIGS. 9A and 9B show a displayed image of a tomographed slice designated by line markers superposed on the images of two arbitrary slices, and an MR image of the tomographed slice.
Figure 9B:
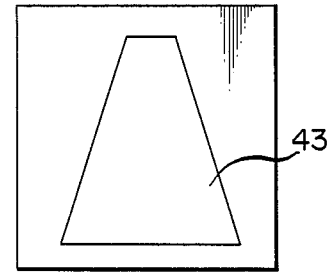
Figure 10:
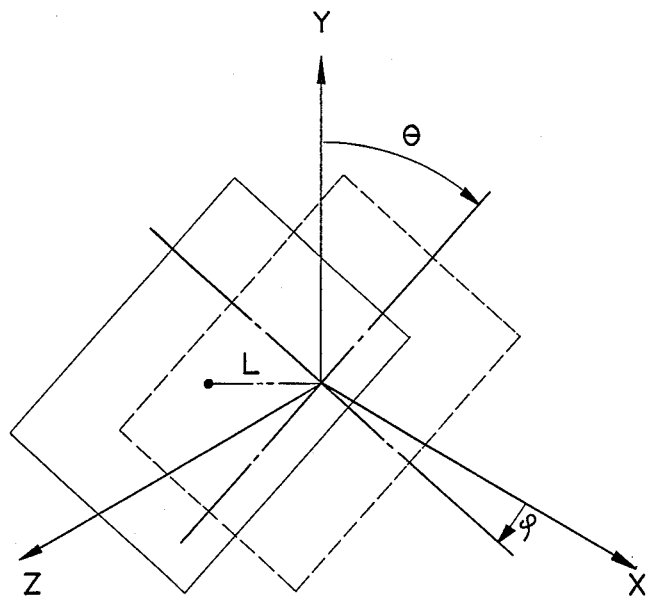
FIG. 10 shows a diagram for explaining the conditions for determining a tomographed slice.

The tomographed slice as specified by the marker coordinates entering includes line markers 31B and 33B as shown in FIG. 8, and serves as tomographed slice 42 intersecting slices 31 and 33. The image 43 on slice 42 is image picked up by MR image pick up section 1.

After end of the designation of the tomographed slice, the operations necessary for collecting data by MR image pick up section 1 is executed in step 9. In this step, a check is made as to whether the data collection conditions for the slices 31 to 33 as already tomographed are changed for tomographing new slice 40 or 42. The result of this check is executed by an operator through his keyboard operation. The reason why this check is required is that, while the tomographing of the arbitrary slices in use for position setting must effectively be done in as short a time as possible and with such a resolution as at most for the position setting, the tomographed slice must be tomographed with a high resolution enough for diagnosis. In the case of the MRI apparatus, unlike the X-rays CT apparatus, the collected data are the diagnosis data including the data different with the tomographing conditions. For this reason, the change of the data collection conditions must be required frequently. This change is executed through the key operation by an operator (step 10).

In step 11, calculation is made of the control parameters for collecting MR data in the tomographed slice. To calculate the parameters, CPU 11 obtains the position data satisfying the position conditions for the tomographed slice, using the marker position coordinates entered by coordinates entry device 22 and the slice position data of the arbitrary slices 31 to 33, and calculates the control parameters, using the position data thus obtained.

Figure 3:
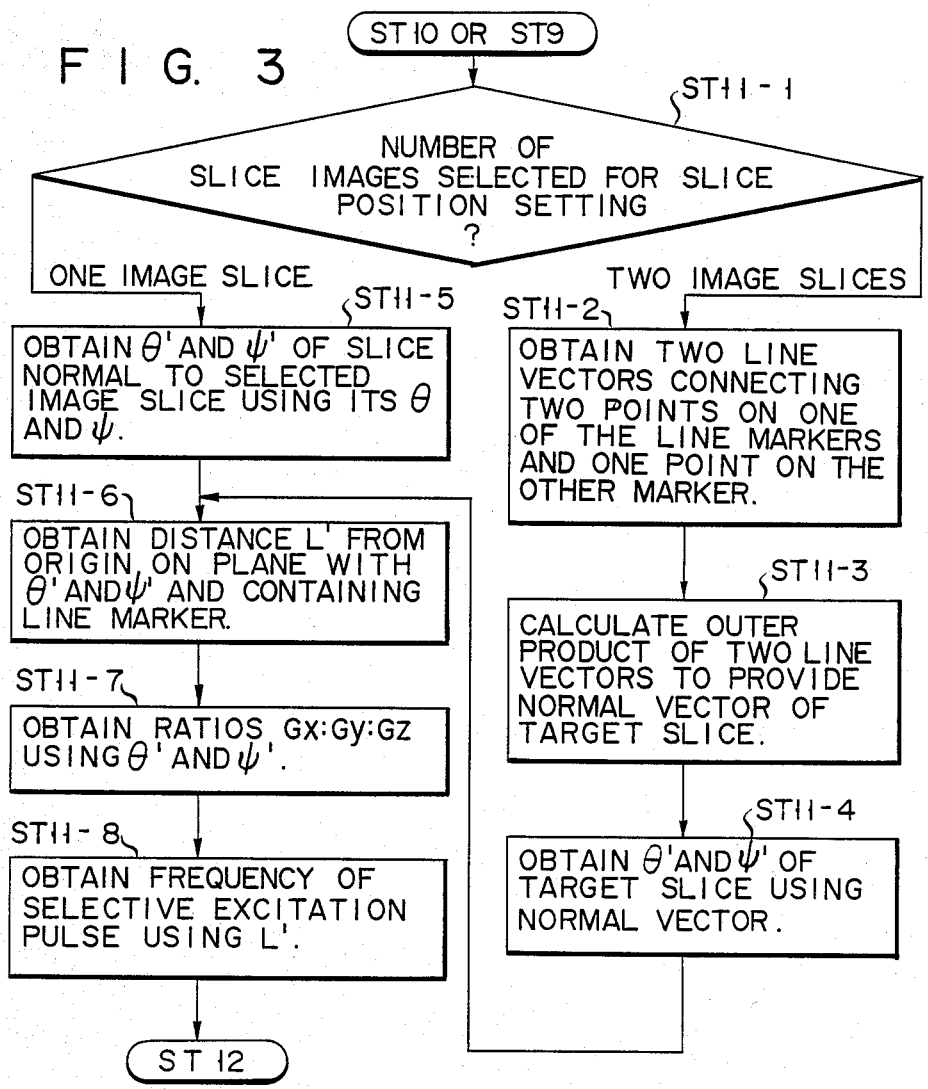
FIG. 3 shows a flowchart showing the details of part of the processing illustrated in FIGS. 2A-2C.

The details of how to calculate the control parameters are illustrated in FIG. 3.

A slice plane, which is handled in this system, is determined by a rotating angle $\theta$ with respect to x-axis on that plane, a rotating angle $\phi$ with respect to the y-axis, and a distance L from the midpoint on the plane.

In FIG. 3, in step 11-1, the number of images used for slice setting (as set in step 5) is first decided. In the case of two images, line vectors connecting two points on one of the line markers to one point on the other line marker is obtained in step 11-2. In step 11-3, the outer product of the two line vectors is obtained, thereby to obtain a normal vector of the designated slice. Using this normal vector, gradient angles $\phi'$ and $\phi'$ of the designated slice are obtained. Then, the control advances to step 11-6.

To designate the tomographed slice using a single arbitrary slice, step 11-5 obtains $\theta'$ and $\phi'$ on the plane orthogonal to an arbitrary slice, using $\theta$ and $\phi$ of the arbitrary slice.

In step 11-6, a distance L' from the original on a 10 plane containing the line marker is obtained using gradients $\theta$ and $\phi'$. In step 11-7, a ratio among gradient magnetic fields Gx, Gy and Gz is obtained using $\theta'$ and $\phi'$. In step 11-8, the frequency of the selective excitation pulse is obtained using L'.

In this way, the control parameters calculated by CPU 11 are input to the system controller 3 in MR image pick up section 1. Under control of system controller 3, MR data collecting section 2 collects data about tomographed slice 40 or 42.

In this system, the arbitrary slice as used for the position setting and the tomographed slice as position set on the basis of the arbitrary slice are displayed by display 20, providing an easy visual check of the relative positions of them. If the images as shown in FIGS. 6 and 8 or FIGS. 7A, 7B, 9A and 9B, for example, are reproduced on the CRT screen, the tomographed slice position can be grasped in a very easy manner. This display of the position relationship of the slices is necessary particularly when after the data on the tomographed slice as position designated are collected, a doctor uses the MR image of the tomographed slice for his diagnosis. Such a display enables the doctor to effectively make the diagnosis on the basis of the tomographed slice image. It is for this reason that in step 12, the data of the designated position of the tomographed slice is stored in any of memory devices 14, 17 and 18, and later the position relationship is visually displayed according to the steps 13 and 14.

Steps 15 to 17 are provided for designating the slices for tomographing the second and succeeding images. In step 15, if it is ordered to designate the tomographed slice on the basis of the same image, the control returns to step 7-1 or 7-2. In step 16, if use of the slice image as previously used is ordered, the control returns to step 5, and is repeated from the selection of the slice to be used. In step 17, if the tomographed slice is specified using the image other than that previously collected, the control returns to step 1. The control is repeated from the condition setting of the collection slices.

It should be understood that the present invention is not limited to the above-mentioned embodiment, but may variously be changed and modified within the scope of the invention. The display means, the tomographed slice position designating means and the display control means may be replaced by any other means with the same functions. More specifically, to designate the tomographed slice position, the dot marker may be used in place of the line marker. To designate the tomographed slice using two arbitrary slice, a plane as defined by two points on one of the slice and one point on the other slice may be designated as the tomographed slice.

In the above-mentioned embodiment, the tomographing area is determined on the assumption that the length of the designated tomographed slice intersecting the arbitrary slice is previously set. Alternatively, the area size or width measured in that direction may be designated by a length of the line marker.

In displaying the relationship of positions of the arbitrary slice and the tomographed slice, if the same arbitrary slice is used for designating different tomographed slices, a plurality of line markers, for example, are displayed on one arbitrary slice, indicating their associated tomographed slices.

Figure 11A:
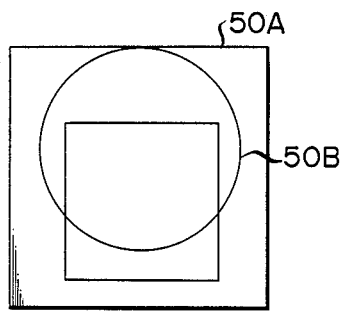
FIGS. 11A and 11B show a displayed image of the tomographed slice as designated by a ring marker superposed on the image of a single arbitrary slice, and an MR image of the tomographed slice.
Figure 11B:
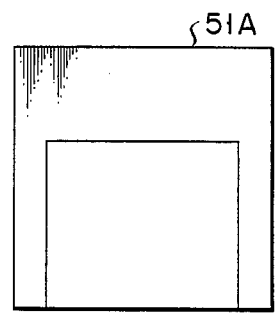

According to another embodiment, the position and size of a desirable part of the image 50A of the arbitrary slice are designated by ring marker 50B, as is shown in FIG. 11A. As a result, an enlarged image (such as that shown as 51A in FIG. 11B) of the designated part is produced.

What is claimed is:
1. An MRI system comprising:
  image pick-up means having a slice select means for selecting a position designated by position data and a gradient magnetic field of a slice, said image pick-up means exciting the magnetic resonance (MR) in the slice of an object under inspection as selected by said slice select means, to collect MR data and to obtain an MR image data;
  memory means for storing the MR image data picked up by said image pick-up means, together with its associated slice position data;
  display means for displaying an MR image corresponding to MR image data;
  MR image display control means for reading out desired MR image data from said memory means, and causing said display means to display the MR image of one or more slices;
  marker display control means for displaying a marker to designate a slice to be imaged, by obtaining set MR image data and for superposing said marker on the MR image of said arbitrary slice as displayed by said display means; and image pick up control means for obtaining the position data representing the position of the image, designated by said marker, on the basis of both the position data of the MR image of said arbitrary slice and the relative position data of said marker with respect to the arbitrary image, and controlling said slice select means of said image pick-up means in response to said position data and relative position data.

2. The MRI system according to claim 1, in which said MR image display control means comprises a means for displaying an MR image of a single arbitrary slice, and said marker display control means comprises a means for displaying the marker for designating the position of a slice normal to the slice corresponding to the displayed image.

3. The MRI system according to claim 2, in which said marker display control means comprises a means for displaying a line marker to indicate the position and the width of the area of the slice to be imaged.

4. The MRI system according to claim 1, in which said MR image display control means comprises a means for displaying MR images of a plurality of parallel slices, and marker display control means comprises a means for displaying a marker to designate the position of a slice intersecting the slices corresponding to the plurality of images.

5. The MRI system according to claim 4, in which said marker display control means comprises a means for displaying two parallel line markers which are determined on the two images of the parallel slices, respectively.

6. The MRI system according to claim 1, in which said marker display control means comprises a means for displaying markers containing dot markers.

7. The MRI system according to claim 1, in which said MR image display control means comprises a means for displaying an MR image of a single arbitrary slice, and said marker display control means comprises a means for displaying the marker to designate either of the position and the size of the area of the slice to be imaged corresponding to the displayed image.

8. The MRI system according to claim 7, in which said marker display control means comprising a means for displaying markers containing a ring marker indicating the position and the size.

9. The MRI system according to claim 1, further comprising pseudo image display control means for forming a pseudo MR image of the slice to be imaged on the basis of the data stored in said memory means, and displaying said pseudo MR image by said display means.

10. The MRI system according to claim 1, further comprising a position display control means for forming an image representing a three-dimensional relationship of the positions of said arbitrary slice and said slice to be imaged on the basis of the data stored in said memory means, and displaying said image by said display means.

* * * * *